United States Patent [19]
Johnson et al.

[11] Patent Number: 5,969,947
[45] Date of Patent: Oct. 19, 1999

[54] INTEGRAL DESIGN FEATURES FOR HEATSINK ATTACH FOR ELECTRONIC PACKAGES

[75] Inventors: Eric Arthur Johnson, Greene; Stephen John Kosteva, Endicott; Stephen Wesley MacQuarrie, Vestal, all of N.Y.

[73] Assignee: International Business Machines Corporation, Armonk, N.Y.

[21] Appl. No.: 08/991,903

[22] Filed: Dec. 17, 1997

[51] Int. Cl.⁶ ...................................................... H05K 7/20
[52] U.S. Cl. ........................ 361/704; 174/16.3; 257/713; 257/718; 361/710
[58] Field of Search .................................. 165/80.2, 80.3, 165/185; 174/16.3; 361/697, 704–705, 707–710, 714–718, 722; 257/706–707, 712–713, 718–719, 722, 726–727, 796

[56] References Cited

U.S. PATENT DOCUMENTS 5,200,809  4/1993  Kwon ...................................... 257/707
5,386,144  1/1995  Variot et al. ............................ 361/714

*Primary Examiner*—Gregory Thompson
*Attorney, Agent, or Firm*—Ratner & Prestia

[57] ABSTRACT

An apparatus and method attaching a heatsink to a surface of an electronic package comprising a substrate, an integrated circuit chip attached to the surface of the substrate, an encapsulant encapsulating the integrated circuit chip and contacting at least a portion of the surface of the substrate, and an orifice formed in the top portion of the encapsulant to attach the heatsink to the surface of the electronic package. The heatsink may be attached and removed as desired to allow for package identification or rework.

18 Claims, 20 Drawing Sheets

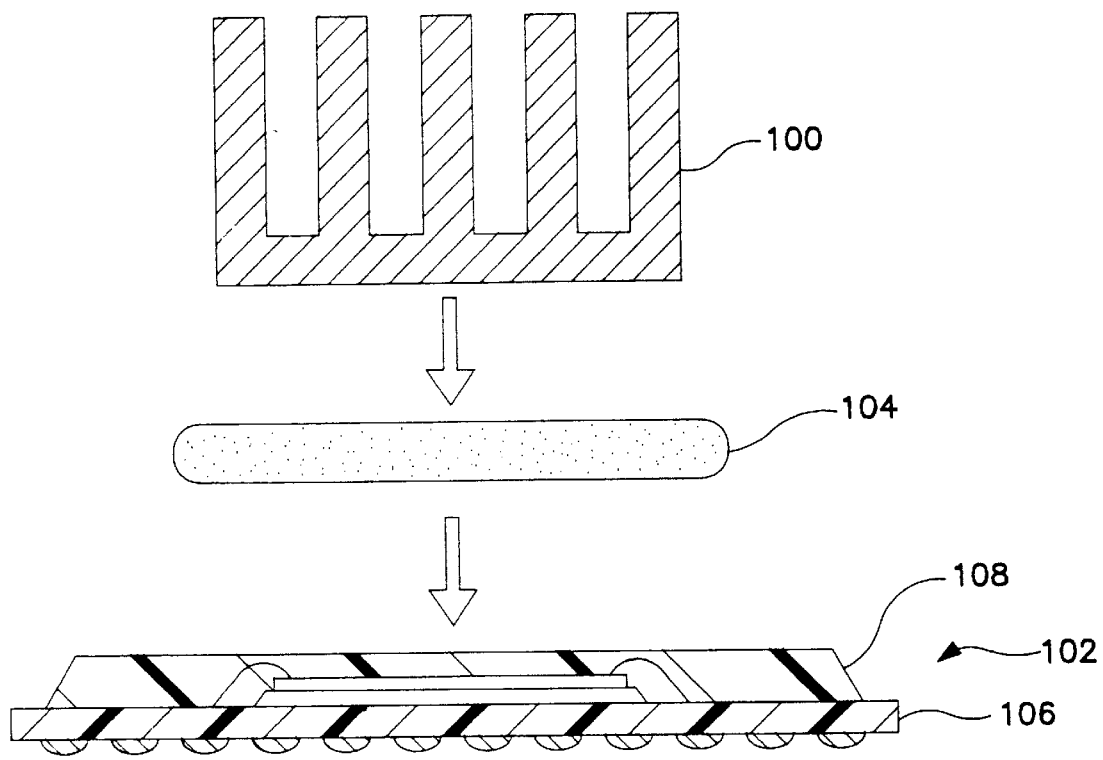
FIG. IA
PRIOR ART

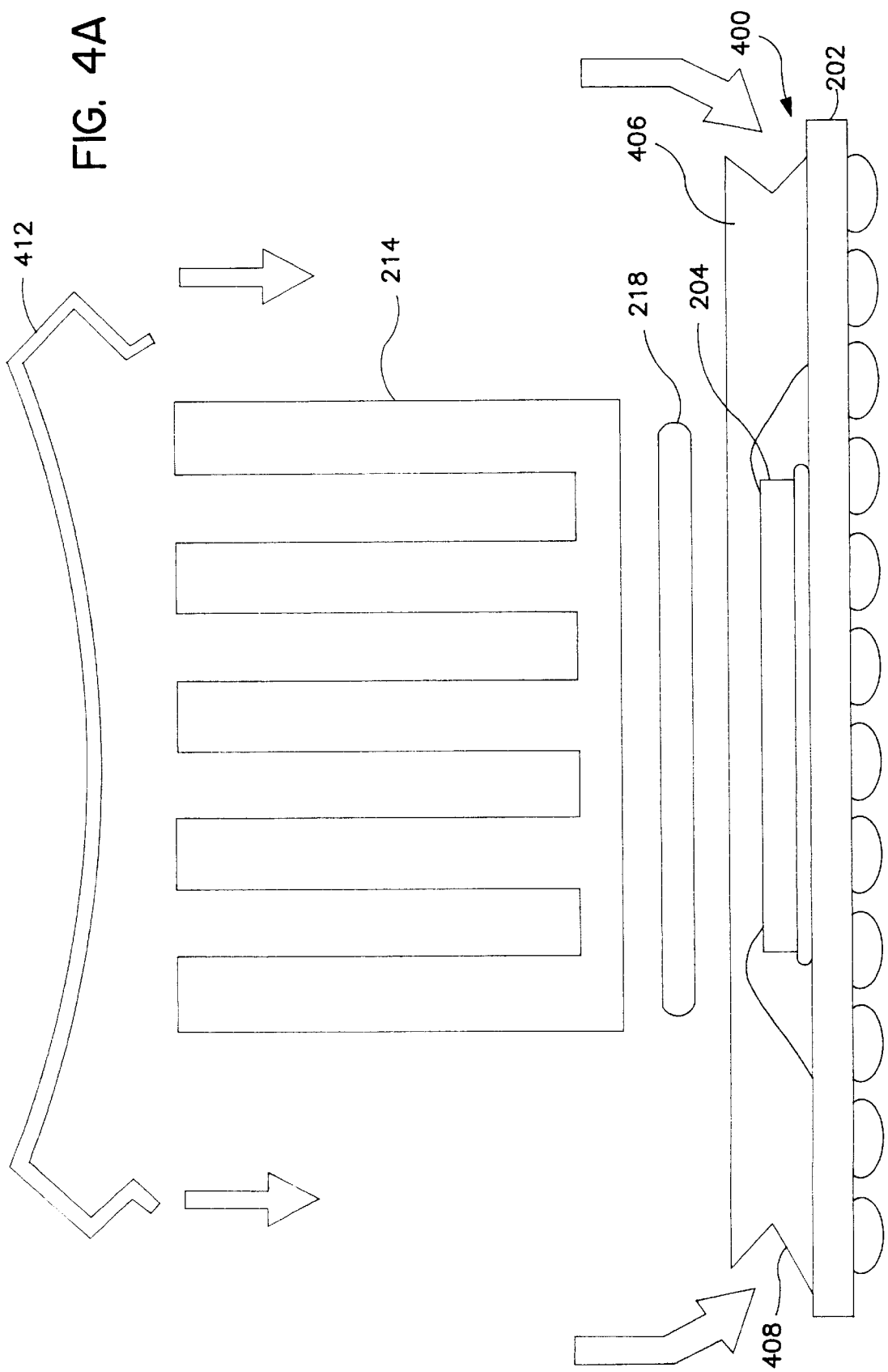

INTEGRAL DESIGN FEATURES FOR HEATSINK ATTACH FOR ELECTRONIC PACKAGES

FIELD OF THE INVENTION

This invention generally relates to electronic packages and, more particularly to an apparatus and method for providing attachment of a heatsink to a surface of an electronic package.

BACKGROUND OF THE INVENTION

Advances in microelectronics technology tend to develop chips which occupy less physical space while performing more electronic functions. Conventionally, the chips are packaged for use in housings which protect the chip from its environment and provide input/output communication between the chip and external circuitry through sockets or solder connections to a circuit board or the like. Miniaturization results in the generation of more heat in less physical space and with less structure for transferring heat from the package.

It is generally desirable to optimize an electronic assembly by providing a maximum number of packages in a minimum amount of space. Similarly, the development of electronic circuits using compound semiconductors further expands the packaging requirements to control device temperatures by heat dissipation for devices which operate at higher temperatures.

One type of semiconductor chip package includes one or more semiconductor chips mounted on a circuitized surface of a substrate, e.g., a ceramic substrate or a plastic substrate. Such a semiconductor chip package, conventionally termed a chip carrier, is usually intended for mounting on a printed circuit card or printed circuit board. In the case of a Ball Grid Array (BGA) package, the chip carrier will include a second circuitized surface opposite the surface to which the chip is attached, which is in turn connected to the printed circuit card or printed circuit board.

One way to obtain a relatively high density of chip connections is readily achieved by mounting one or more semiconductor chips on the circuitized surface of a chip carrier substrate in the so-called flip chip configuration. In this configuration, the chip or chips are mounted active side-down on solderable metal pads on the substrate using solder balls, a controlled collapse chip connection (C4), a gold bump, or a conductive epoxy. Unfortunately, the coefficient of thermal expansion (CTE) of, for example, a silicon chip is significantly different from the CTE of a plastic substrate. As a consequence, if a chip carrier is subjected to thermal fluctuations, then the solder ball connections will be subjected to significant stresses, which tend to weaken, and reduce the fatigue life of, the solder ball connections.

Another way to mount a chip to a substrate is to use a wirebond attachment. Cost is one of the primary considerations when choosing a wirebond chip carrier package. Plastic flatpacks and plastic ball grid array (PBGA) chip overmolded packages are often chosen as possible chip carrier solutions because of their low cost. One major problem with these chip carriers is, however, that they are inherently poor thermal performers because they are plastic. With the common trend in electronic packaging of increasing chip powers, compounded with competitive pricing, packaging engineers are pushing the thermal threshold of these packages. These higher power chips are beginning to require enhanced thermal solutions, but the cost of these thermal solutions adds significant development and manufacturing costs and, thus, increases the overall price of the product.

In order to conduct heat from the chip to the exterior of the package, many device packages include a high thermal conductivity transfer medium which is in thermal communication with the chip and has a dissipation surface adjacent to the surface of the package. Other packages merely conduct the heat through the material of the package itself. In order to further dissipate heat from the package, an external heatsink may be attached to the device package. Typically, the heatsink is a body of material such as metal which has a relatively high thermal conductivity. The heatsink ordinarily has at least one flat face for positioning adjacent to a face of the device package and may include fins, pins, or other structures for dissipating thermal energy into the surrounding atmosphere.

FIGS. 1A and 1B illustrate a prior art method for attaching a heatsink 100 to plastic package 102 (comprising laminate 106 and overmold 108). The prior art consists of epoxy attach 104 as shown in FIG. 1A (which tends to be expensive and adds extra processing steps) or a clip 110 (as shown in FIG. 1B) around the edge of laminate 106 which causes laminate 106 to separate or warp resulting in intermittent contact with the circuit board as a result of the force exerted on plastic package 102.

U.S. Pat. No. 5,510,956 issued to Suzuki discloses a device for attaching a heatsink to an integrated circuit chip. As shown in FIG. 1C, circuit chip 120 is attached to substrate 122. Resin 124 insulates circuit chip 120 from metal encapsulant 126. Heatsink 128 is then attached to metal encapsulant 126 by soldering heatsink 128 to metal encapsulant 126. This is a labor-intensive process and does not allow simple detachment of heatsink 128.

SUMMARY OF THE INVENTION

It is an object of the invention to provide an electronic package assembly that can mount a heatsink to the electronic package using a clip which is attached to the top surface of the electronic package.

The electronic package is provided with integral features for low cost heatsink attachment in electronic chip carriers. Because they are integral, the features require no new process steps during chip carrier manufacturing and add minimal cost to the finished product. These features can be implemented into the normal process flow of manufacturing for both heatsink and non-heatsink parts. Therefore, if a customer later decides that it needs thermal enhancement, a thermal solution can be added using the existing features. These features also allow the customer to use cost-effective, off-the-shelf, extruded heatsinks (available from a variety of heatsink vendors).

To solve the aforementioned disadvantages of the conventional heatsink attachments and methods, the present invention provides an apparatus and method for attaching a heatsink to a surface of an electronic package. The apparatus comprises a substrate, an integrated circuit chip attached to the substrate, a member encapsulating the integrated circuit chip and contacting the substrate, and attaching structure formed in the top portion of the encapsulating means.

The present invention also relates to an apparatus for attaching a heatsink to an electronic package where the attaching structure is formed in the top portion of the substrate, along an edge of the encapsulating member, or through the substrate. The present invention also relates to a method for attaching a heatsink to a surface of an electronic package by attaching an integrated circuit chip to a substrate, encapsulating the integrated circuit chip with an encapsulant, and forming an attachment in the top of the encapsulant. These features have low cost, can be implemented in the early design stages of the module, provide a heatsink option for customers, and are removable for module identification and rework.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 1A is an exploded view of a prior art heat dissipation attachment using an adhesive;

FIGS. 4A–4C are side views of a third exemplary embodiment of the present invention;

DETAILED DESCRIPTION OF THE PREFERRED EMBODIMENTS

Figure 1B:
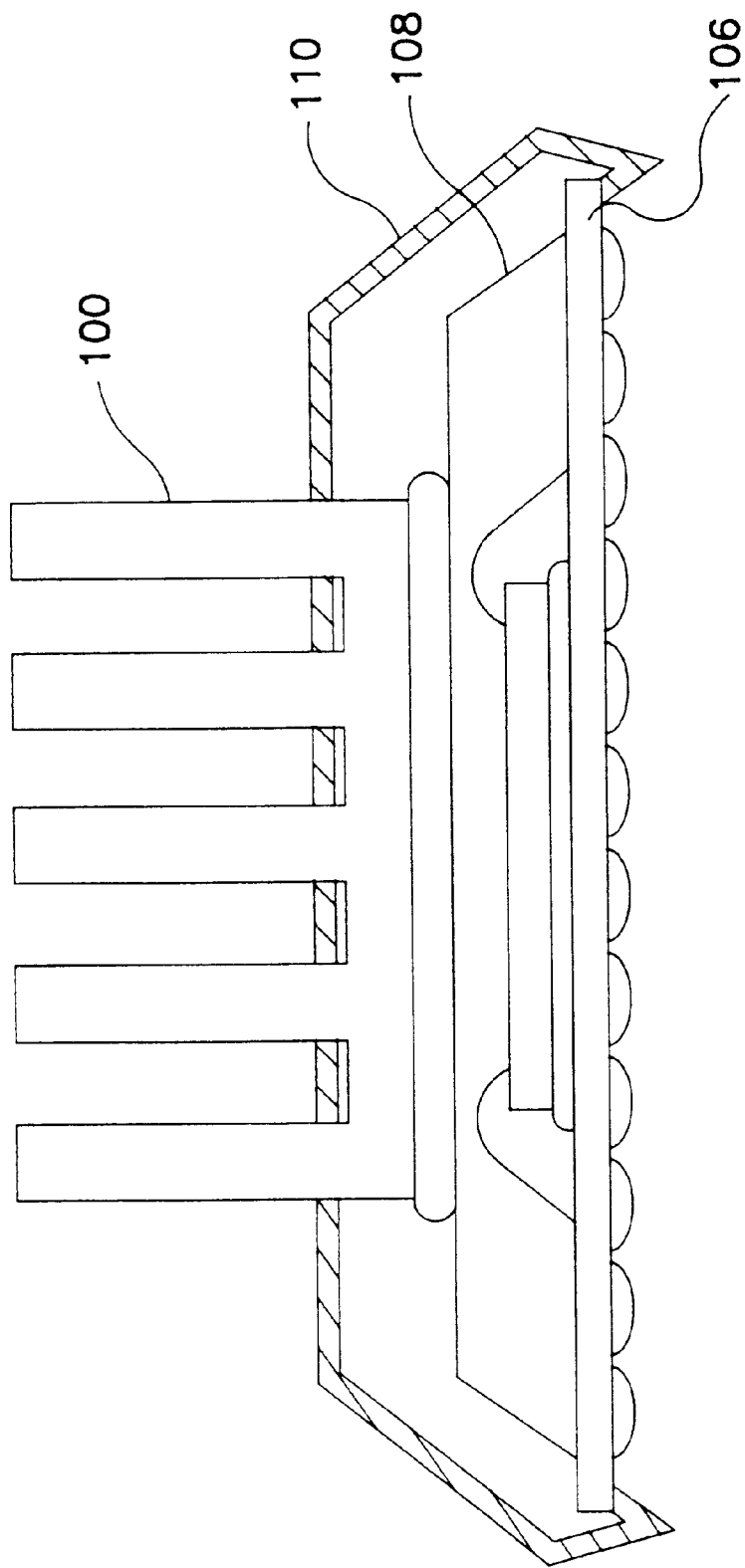
FIG. 1B is a side view of an assembled prior art heat dissipation attachment using a spring clip.
Figure 1C:
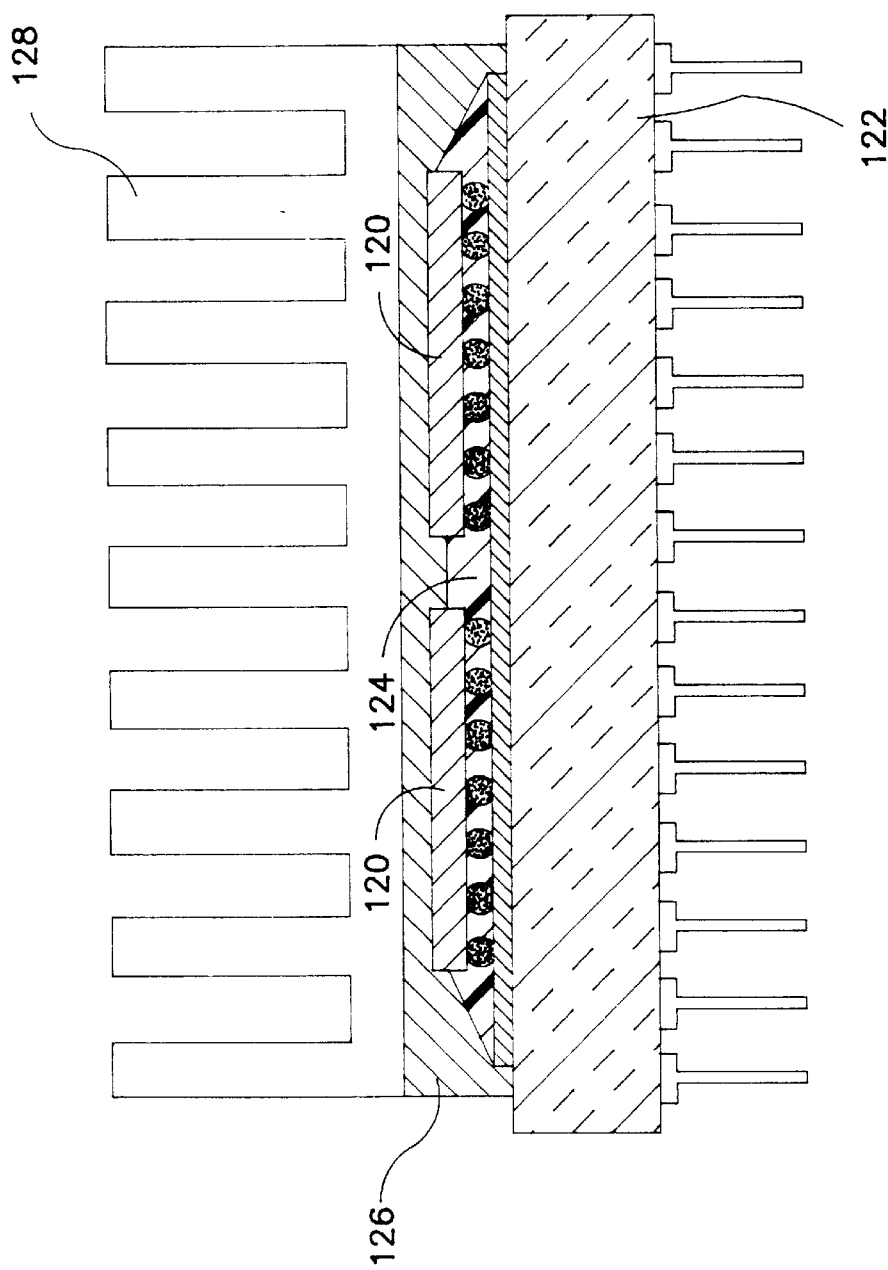
FIG. 1C is side view of another prior art heat dissipation attachment.
Figure 2A:
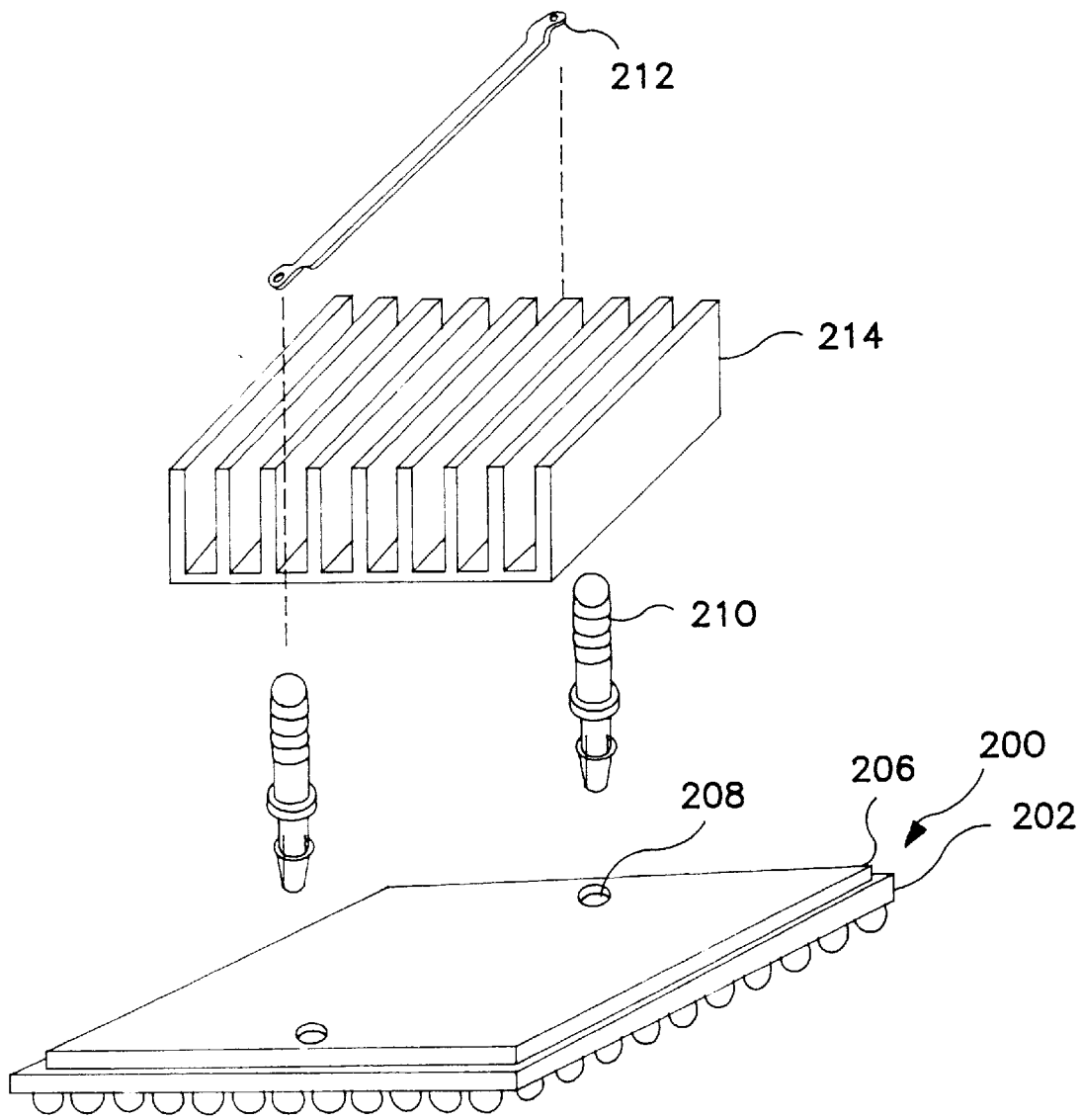
FIG. 2A is a perspective view of a first exemplary embodiment of the present invention.

Referring to FIG. 2A, a perspective view of an exemplary embodiment of the present invention is shown. In FIG. 2A, electronic package 200 is comprised of substrate 202, integrated circuit chip 204 (see FIG. 2B), and encapsulant 206. Within encapsulant 206, apertures 208 are formed. Apertures 208 allow for attachment of heatsink 214 to the top surface of encapsulant 206 using pins 210 and holder 212.

Figure 2B:
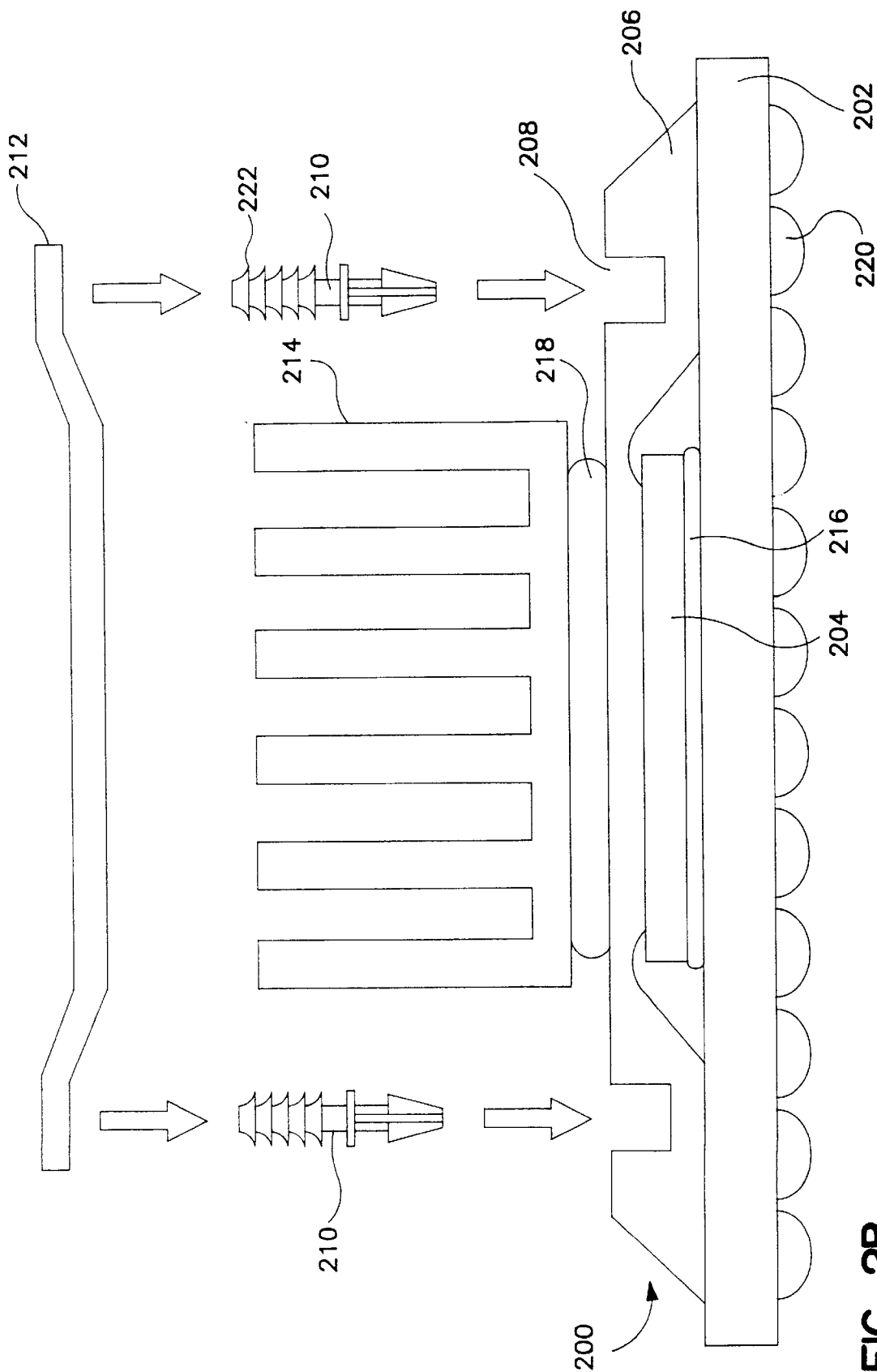
FIGS. 2B–2E are side views of the exemplary embodiment of FIG. 2A.
Figure 2C:
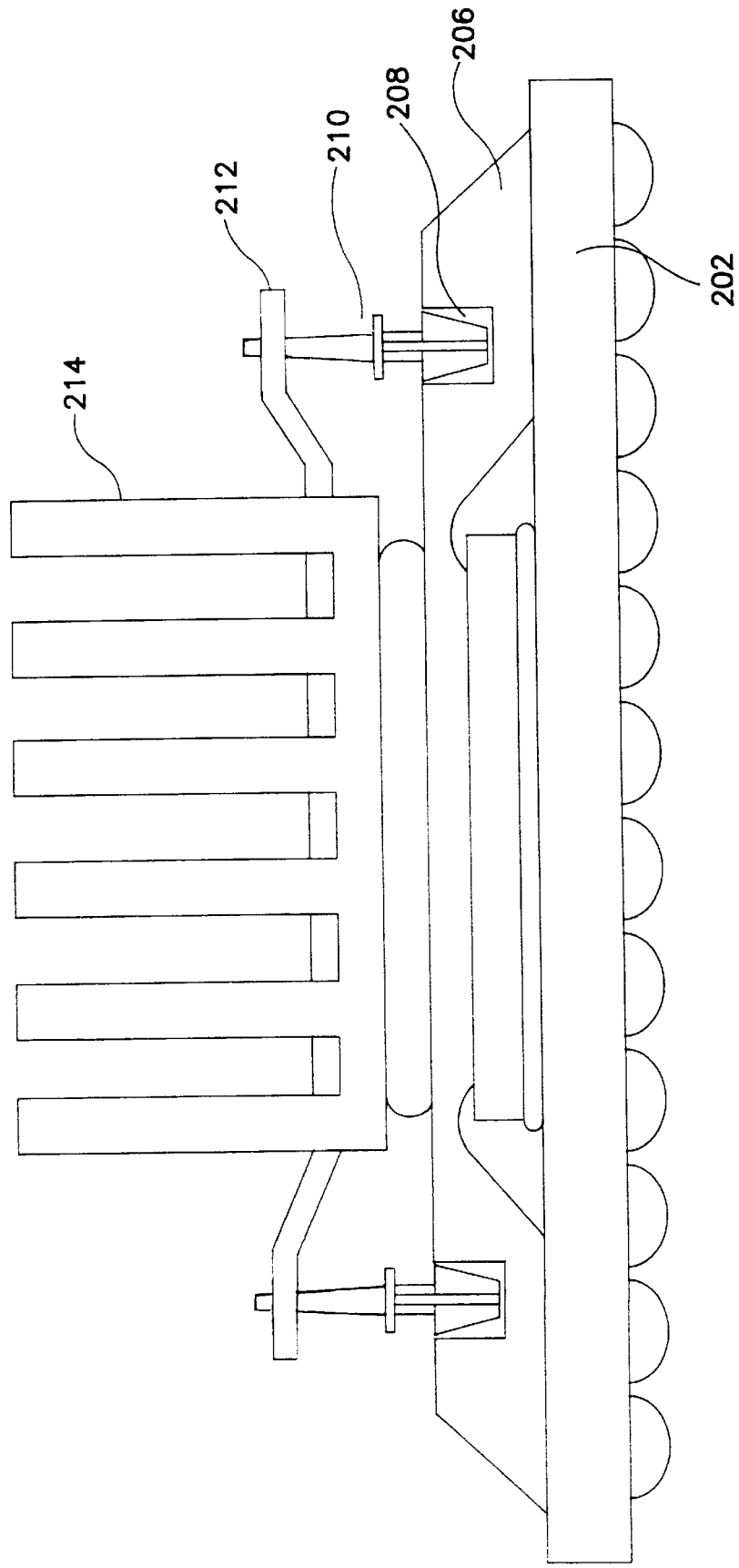

Referring now to FIG. 2B, a side view of the first exemplary embodiment is shown. In FIG. 2B, integrated circuit chip 204 is shown attached to the top of substrate 202 by an adhesive, such as epoxy. Substrate 202 may be a multilayer laminated substrate, for example, and may be made from a polymer or any other suitable material such as a ceramic greensheet. After integrated circuit chip 204 is attached to substrate 202, using bonding agent 216, such as epoxy, encapsulant 206 is applied. Encapsulant 206 may be an overmold formed from a polymer or other suitable material. Aperture 208 is formed in the surface of encapsulant 206 and, as shown in FIG. 2C, accommodates pin 210 when inserted therein if a thermal solution, such as heatsink 214, is desired. If a heatsink is desired, pins 210 are inserted into apertures 208, heatsink 214 is placed on encapsulant 206, and holder 212 is placed across heatsink 214 and coupled to the top of pins 210 to hold heatsink 214 in place. Pins 210 may be a push pin, a threaded post, a solder pin, or any other suitable device. Pins 210 may have retainers 222 if necessary to maintain holder 212 in place. Holder 212 may be released from pins 210, however, if it becomes necessary to remove heatsink 214 from electronic package 200.

Optionally, a heat transfer medium 218, such as thermal grease, may be used between heatsink 214 and encapsulant 206. As a further option, heat transfer medium 218 may be an adhesive compound which provides heat transfer features such as epoxies, acrylics, conductive pads, and thermal tapes.

Electronic package 200 may be attached to a circuit board (not shown), for example, using a ball grid array (BGA) 220. Attachment to the circuit board is not affected by the attachment of heatsink 214 to electronic package 200; heatsink 214 may be attached before or after electronic package 200 is attached to the circuit board.

FIG. 2C shows the completed assembly according to the first exemplary embodiment of the present invention. Pins 210 may be removed from aperture 208 without damaging encapsulant 206 or electronic package 200 thereby allowing for rework or module identification. Alternatively, holder 212 may be de-coupled from pins 210 in order to remove heatsink 214 from electronic package 200.

Figure 2D:
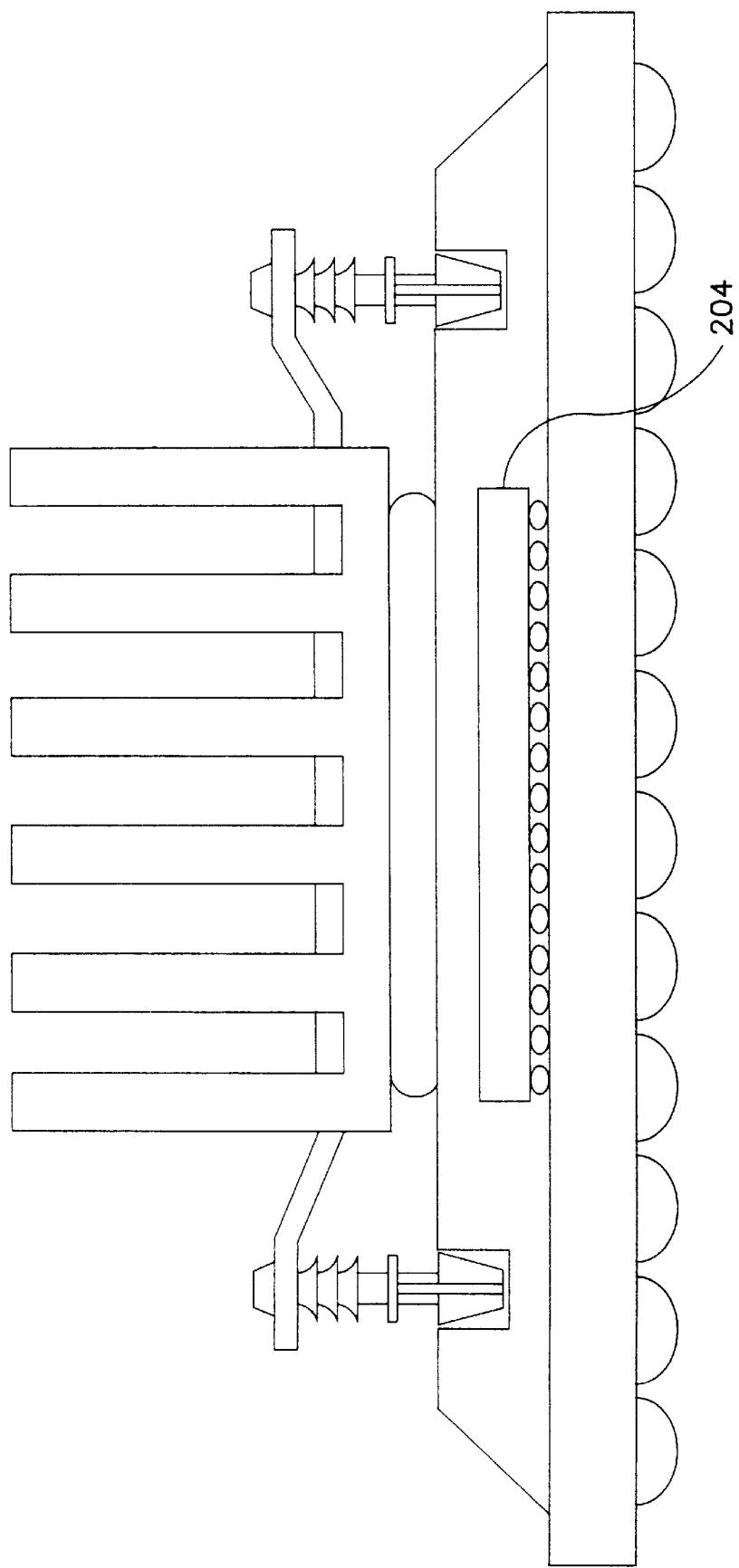
Figure 2E:
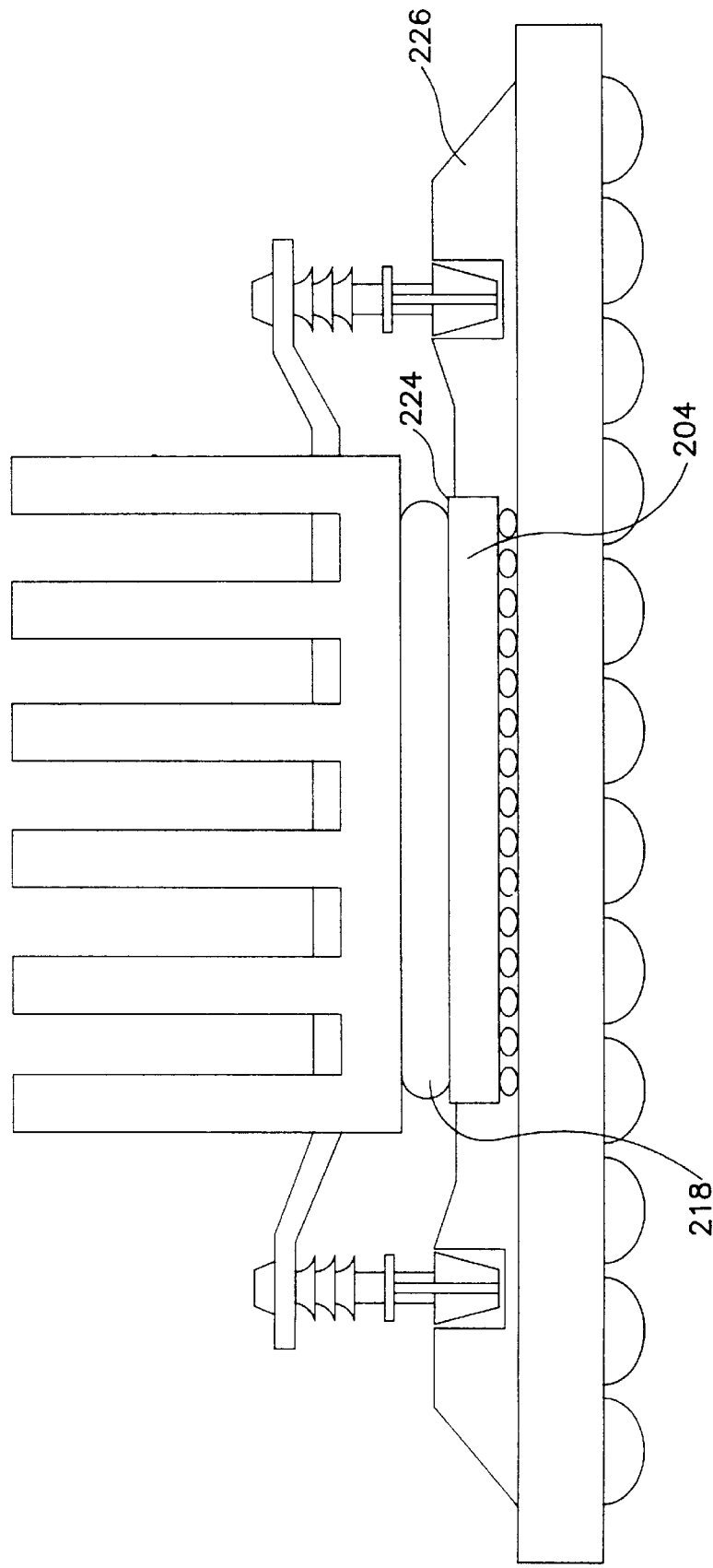

As shown in the exemplary embodiment of FIGS. 2B and 2C, integrated circuit chip 204 is a wirebond chip. The invention is not limited to this exemplary embodiment and, as shown in FIG. 2D, integrated circuit chip 204 may be a flip-chip. In this case, however, it is not necessary for encapsulant 206 to cover the upper surface of integrated circuit chip 204. This is illustrated in FIG. 2E, where encapsulant 226 is disposed over substrate 202 but does not encroach upon upper surface 224 of integrated circuit 204. In this exemplary embodiment, encapsulant 226 may be level with, lower than, or higher than upper surface 224.

Figure 3A:
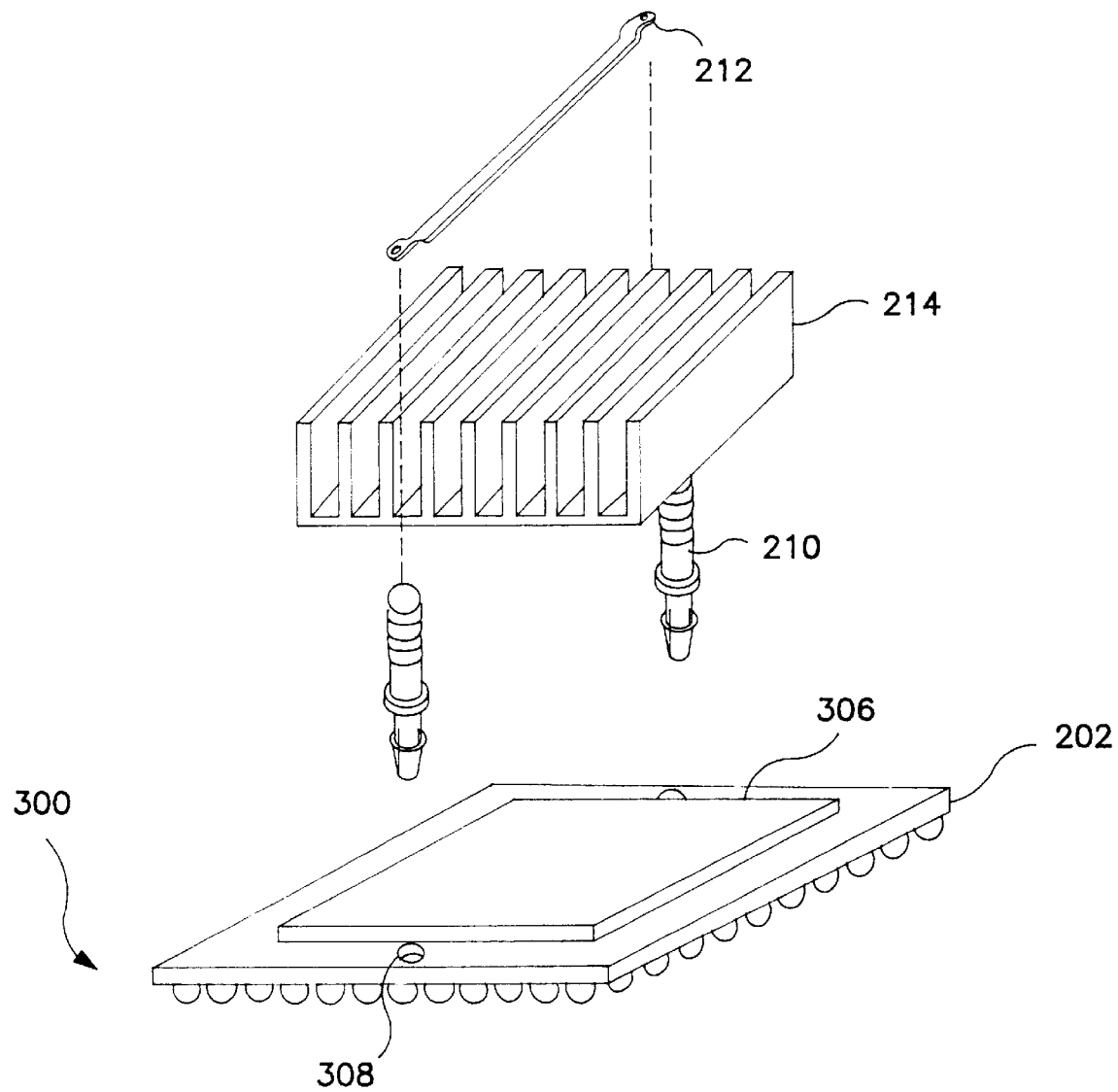
FIG. 3A is a perspective view of a second exemplary embodiment of the present invention.

Referring to FIGS. 3A–3E, a second exemplary embodiment of the present invention is shown. FIG. 3A shows that electronic package 300 is comprised of substrate 202, integrated circuit chip 204 (see FIG. 3B), encapsulant 306, and orifice 308. In this exemplary embodiment, orifice 308 is formed through the surface of substrate 202 rather than in the surface of encapsulant 306.

Figure 3B:
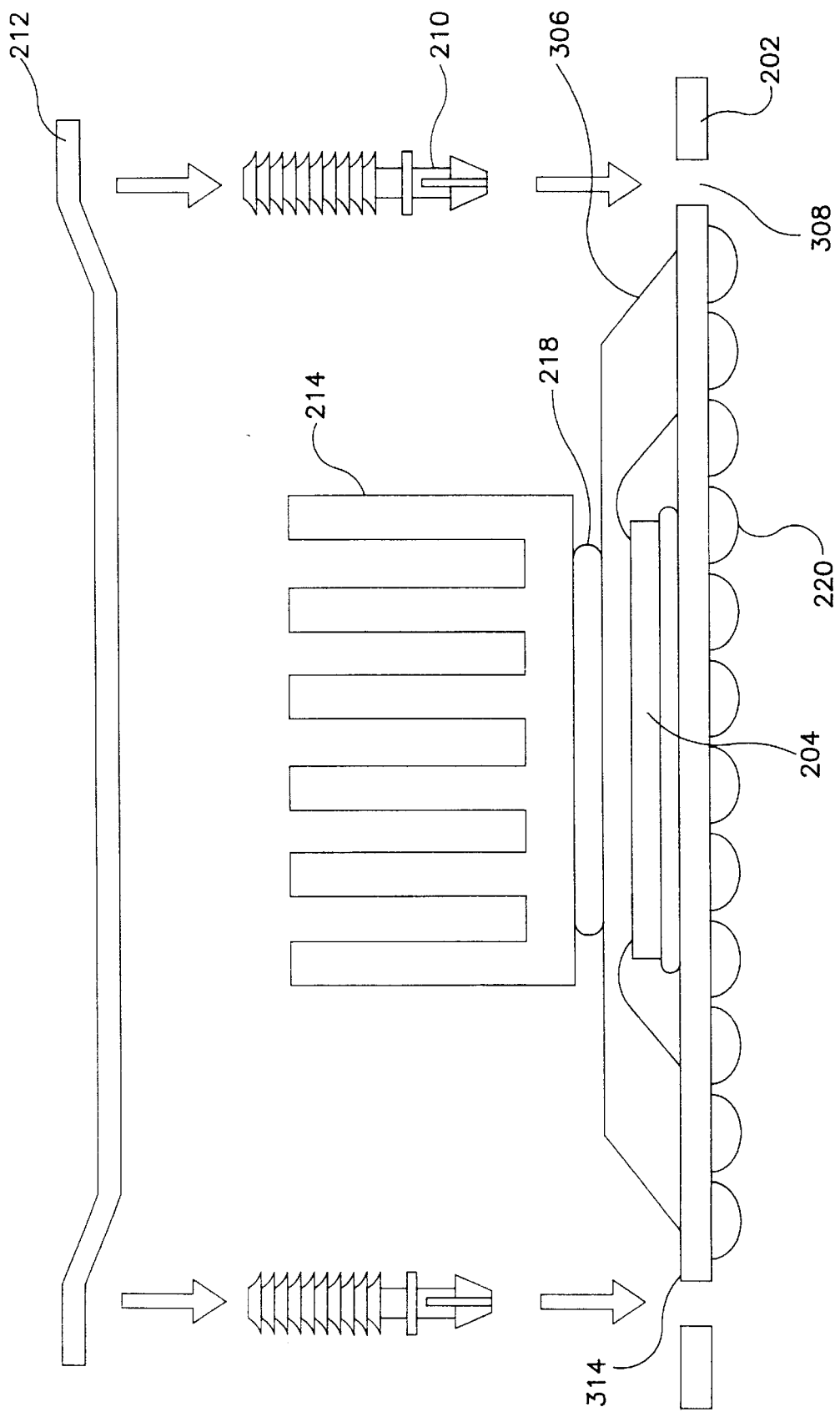
FIGS. 3B–3E are side views of the exemplary embodiment of FIG. 3A.
Figure 3C:
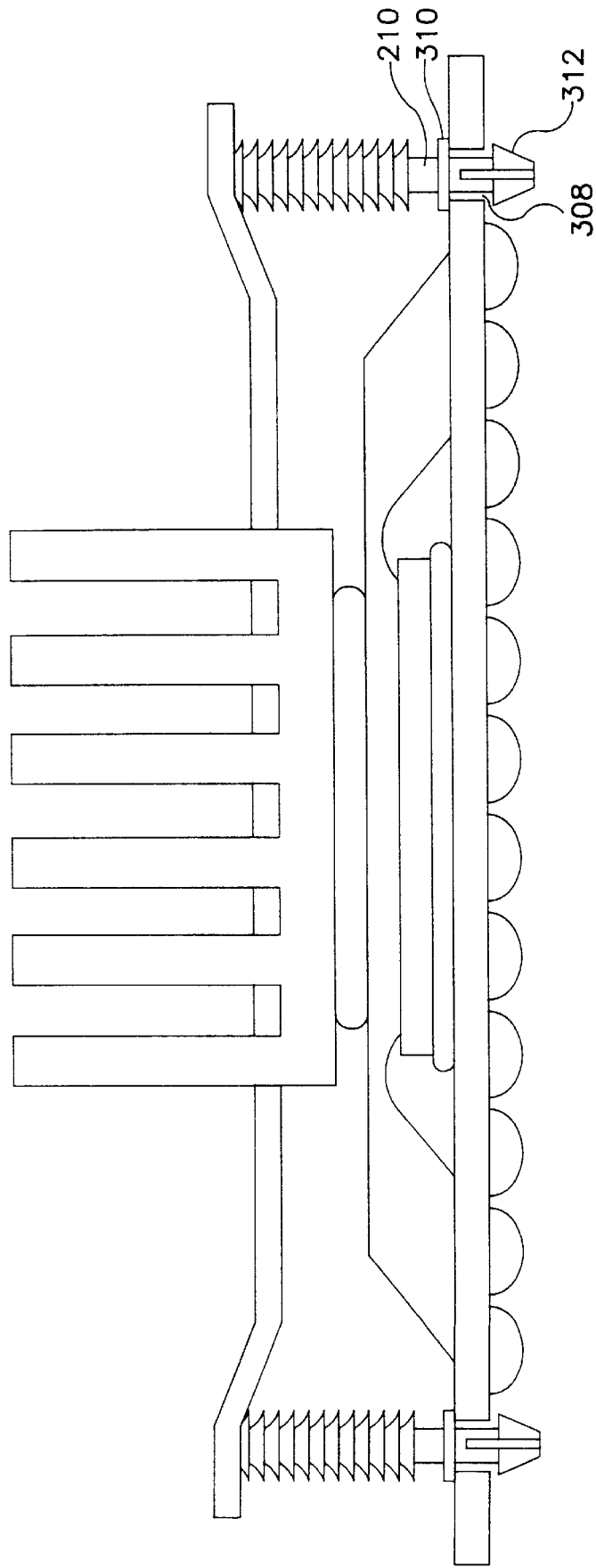

Referring to FIGS. 3B and 3C, side views of the second exemplary embodiment of FIG. 3A are shown. FIG. 3B depicts the interaction of elements during assembly and FIG. 3C depicts the completed assembly according to this embodiment.

As shown in FIG. 3B, elements similar to those of the first exemplary embodiment are shown with identical designations. After integrated circuit chip 204 is mounted to substrate 202, encapsulant 306 is applied to integrated circuit chip 204 and substrate 202. In this case, however, encapsulant 306 is applied to less of the surface of substrate 202 than in the first exemplary embodiment and encapsulant 306 is not applied to a portion 314 of substrate 202 to provide an unobstructed surface for the formation of orifice 308. As in the first embodiment, encapsulant 306 may be an overmold formed from a polymer or other suitable material. Orifice 308 is formed through substrate 202 in this case to accommodate pins 210 if a thermal solution is desired. Orifice 308 may be a simple through hole or may be a through hole plated with a suitable material.

Figure 3D:
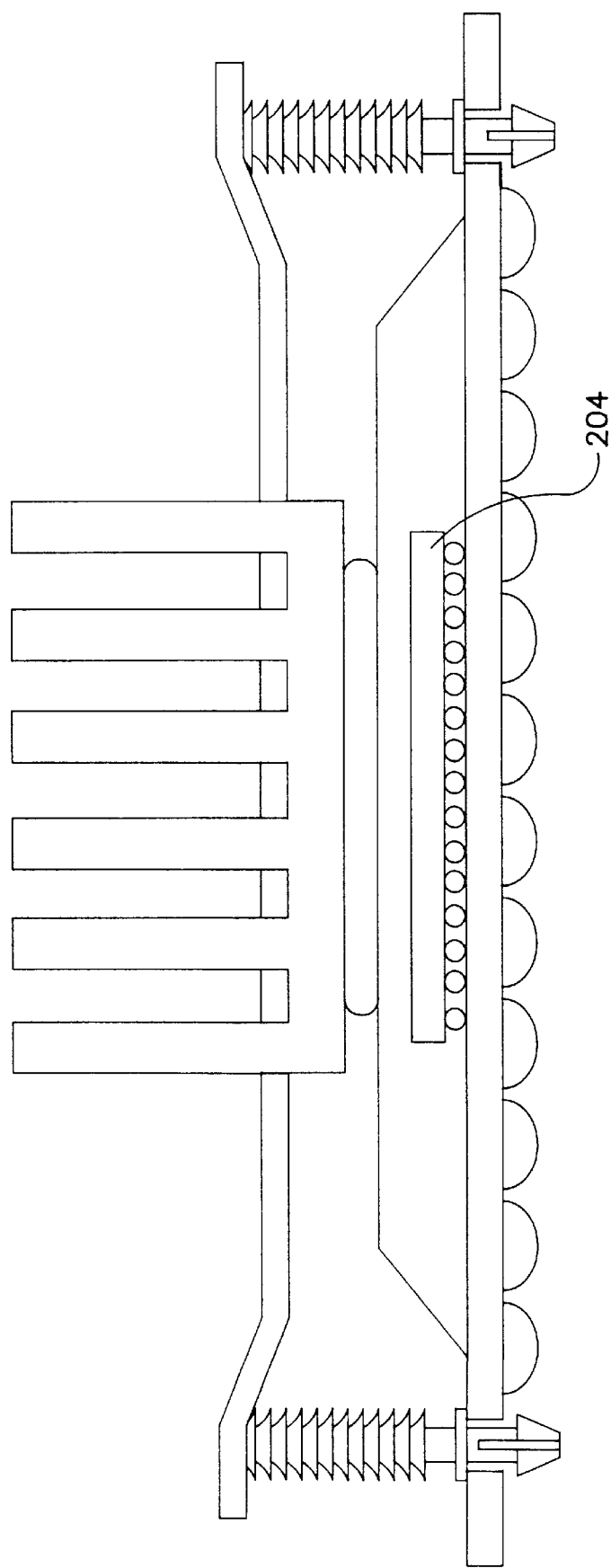
Figure 3E:
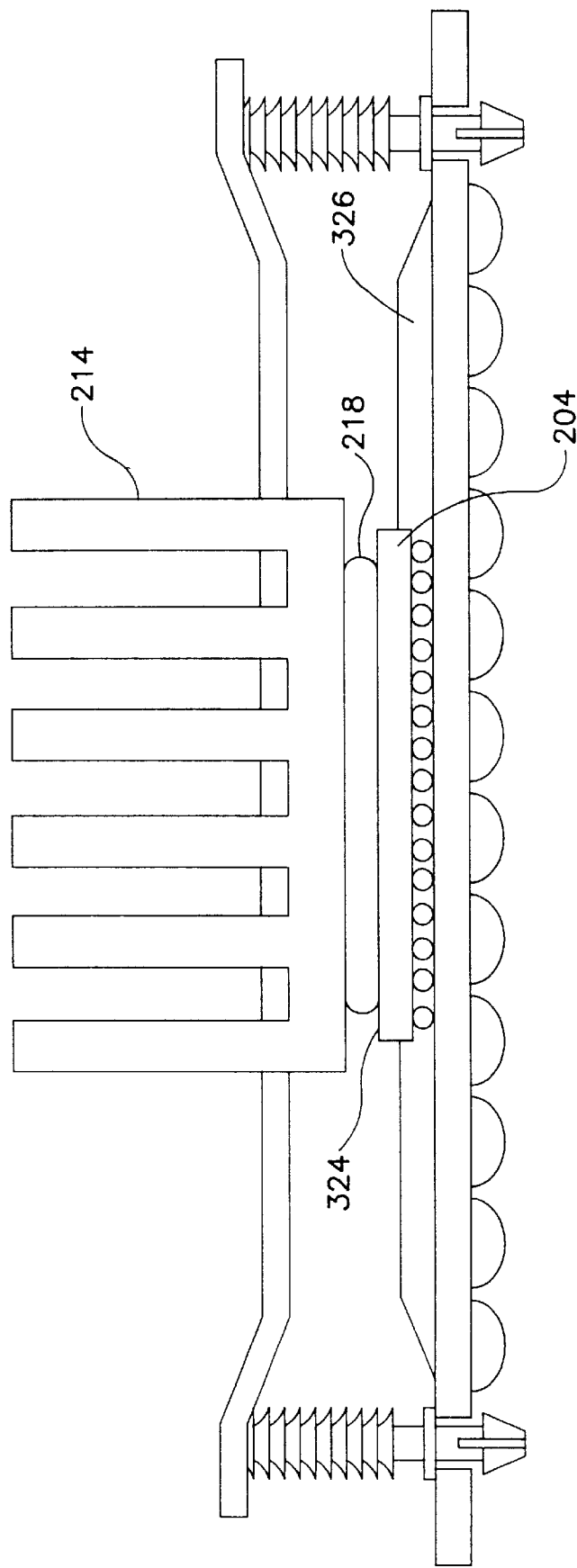

As shown in FIG. 3C, pin 210 mates with orifice 308 to hold pin 210 in place between retainer ring 310 and clip portion 312. This allows pin 210 to be easily removed if desired by compressing clip portion 312 and extracting pin 210 from orifice 308. As shown in FIG. 3C, integrated circuit chip 204 is a wirebond chip. The invention is not limited to this exemplary embodiment and, as shown in FIG. 3D, integrated circuit chip 204 may be a flip-chip, or any other suitable device. In this case, however, it is not necessary for encapsulant 306 to cover the upper surface of integrated circuit chip 204. This is illustrated in FIG. 3E, where encapsulant 326 is disposed over substrate 202 but does not encroach upon upper surface 324 of integrated circuit 204. In this exemplary embodiment, encapsulant 326 may be level with, lower than, or higher than upper surface 324.

It is also contemplated that in any of the above exemplary embodiments more than one holder 212 may be used to couple heatsink 214 to the encapsulant 206, 306. If more than one holder 212 is used, however, it is necessary to use additional pins 210 and apertures 208, 308 accordingly.

Figure 4B:
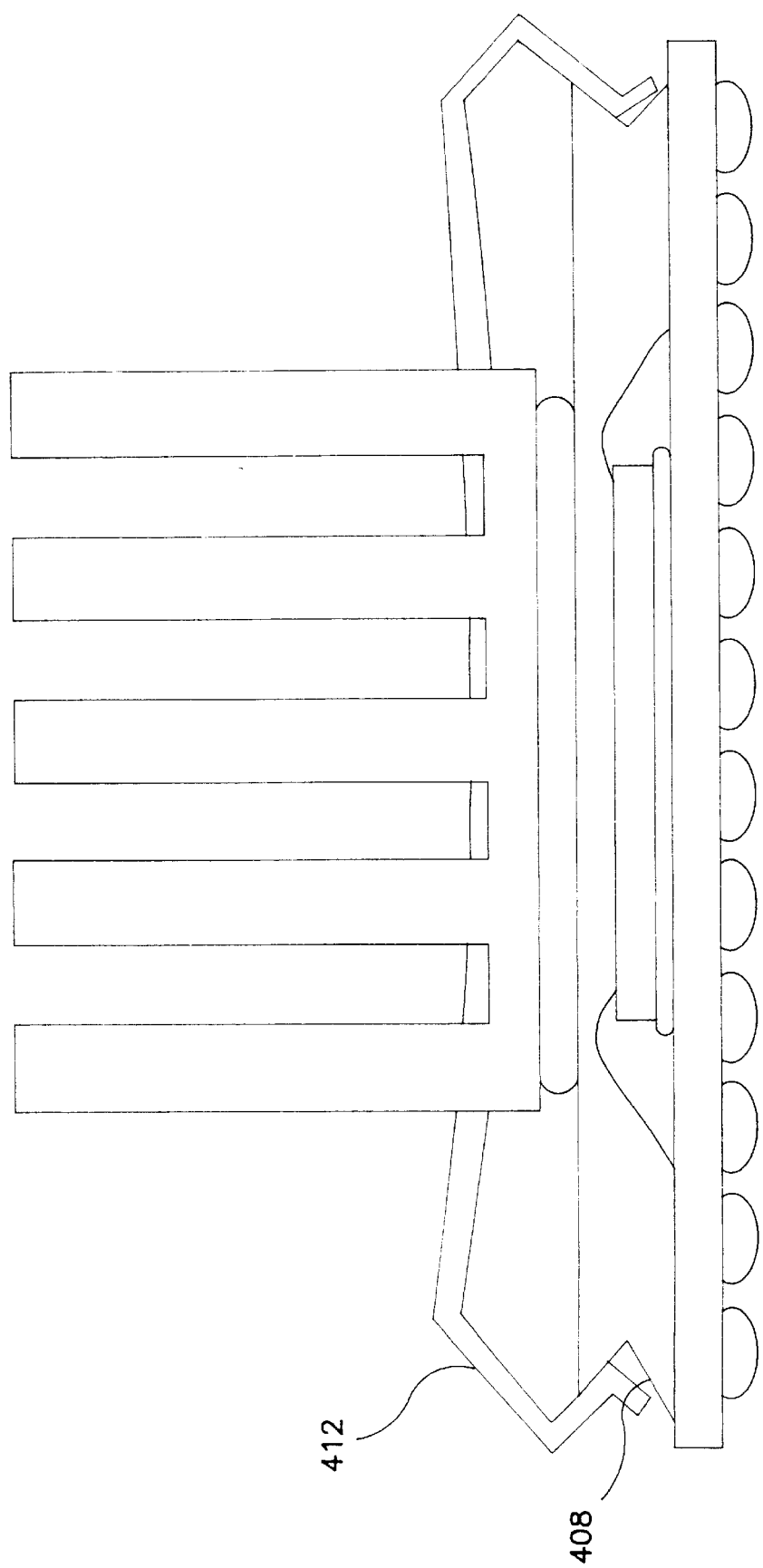
Figure 4C:
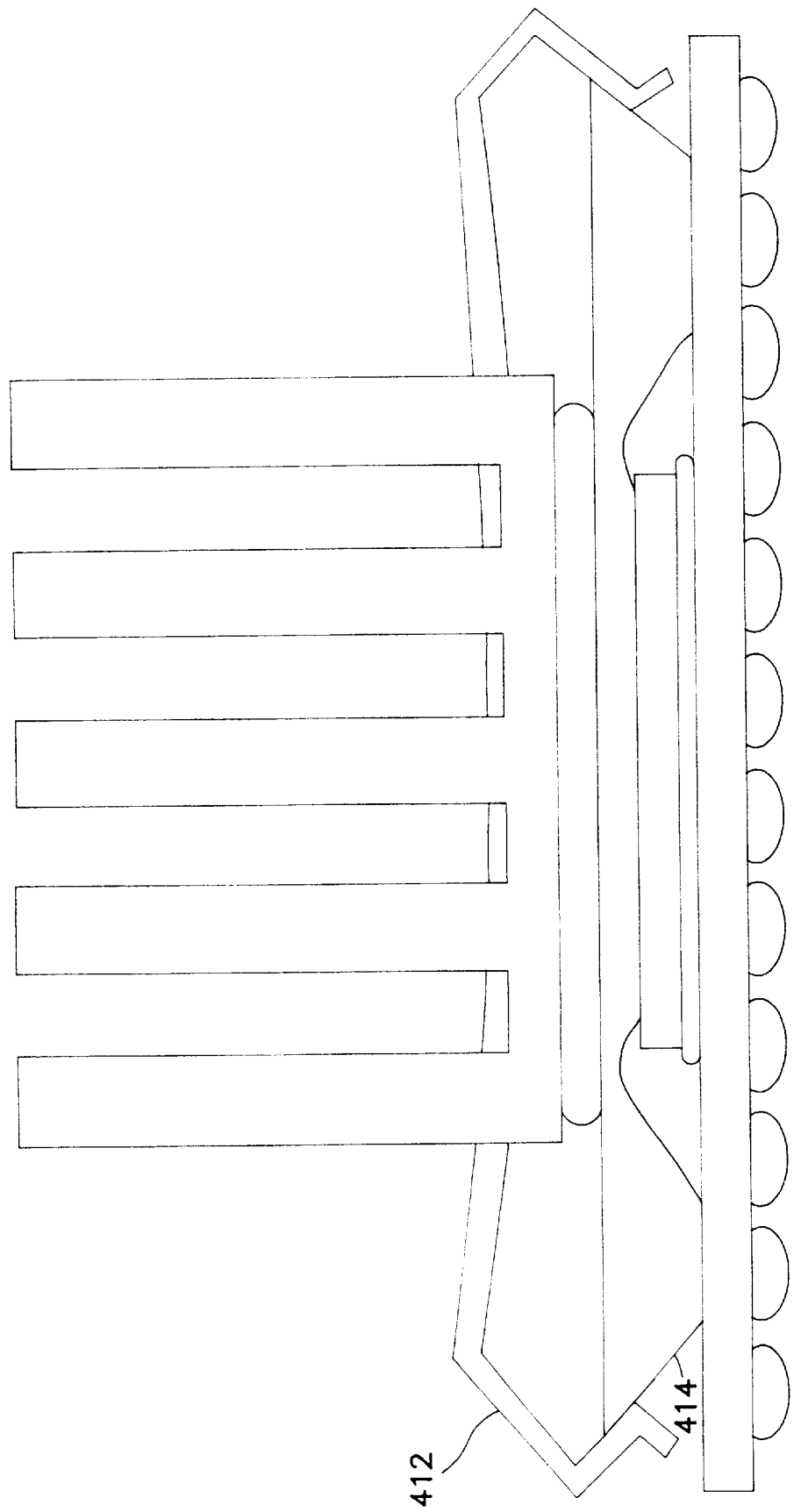

Referring to FIGS. 4A–4C a third exemplary embodiment of the present invention is shown. FIG. 4A shows that electronic package 400 is comprised of substrate 202, integrated circuit chip 204, encapsulant 406, and groove 408. In this exemplary embodiment groove 408, is formed along an edge of encapsulant 406 rather than in the surface of encapsulant 206 of FIG. 2B. As shown in FIG. 4A, elements similar to those of the first exemplary embodiment are shown with identical designations.

After integrated circuit chip 204 is mounted to substrate 202, encapsulant 406 is applied to integrated circuit chip 204 and substrate 202 similar to the first exemplary embodiment. As in the first embodiment, encapsulant 406 may be an overmold formed from a polymer or other suitable material. Groove 408 is formed along the edge of encapsulant 406 in this case to accommodate holder 412 if a thermal solution is desired. Groove 408 may be a V-shaped groove or any other shape suitable to mate with holder 412. Grooves 408 are formed on opposite sides of encapsulant 406 so that holder 412 may snap into place and maintain heatsink 214 in contact with the top surface of electronic package 400 as shown in FIG. 4B. Optionally, heat transfer medium 218 may be used between encapsulant 406 and heatsink 214 as in the first exemplary embodiment. Holder 412 may be a unitary resilient member formed from a metal, a polymer, or any other suitable material. In addition, holder 412 may be a single holder or more than one holder as desired. FIG. 4C is similar to FIG. 4A except that in place of groove 408 protrusion 414 is formed in encapsulant 406 to couple with holder 412.

Figure 5A:
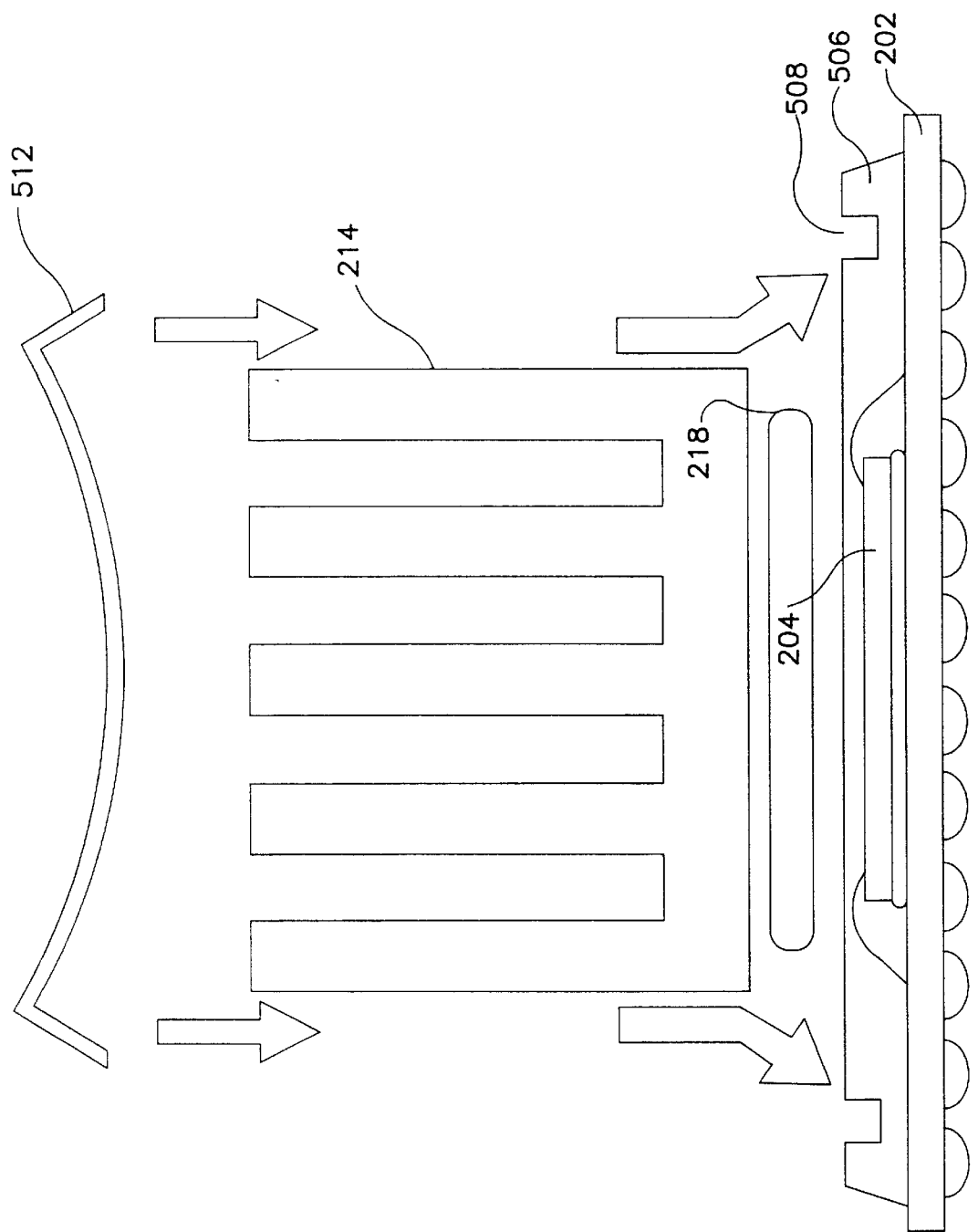
FIGS. 5A and 5B are side views of a fourth exemplary embodiment of the present invention.
Figure 5B:
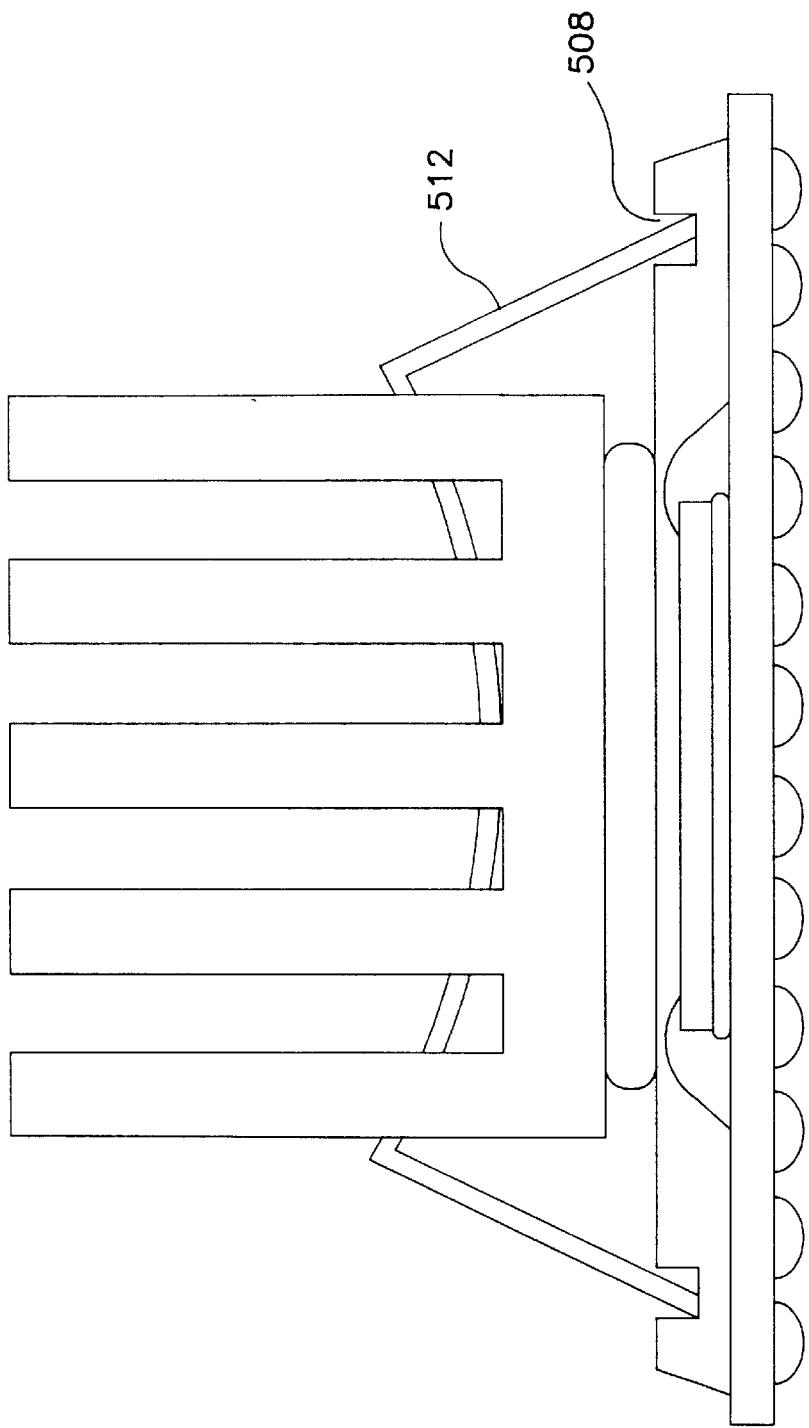

Referring to FIGS. 5A and 5B, a fourth exemplary embodiment of the present invention is shown. FIG. 5A shows that electronic package 500 is comprised of substrate 202, integrated circuit chip 204, encapsulant 506, and slot 508. In this exemplary embodiment, slot 508 is formed in the surface of encapsulant 506 rather than along the edge of encapsulant 406 as shown in FIG. 4A. Elements similar to those of the first exemplary embodiment are shown with identical designations.

As shown in FIG. 5A, slot 508 is formed in the surface of encapsulant 506 in this case to accommodate holder 512 if a thermal solution is desired. Slot 508 may be a U-shaped slot or any other shape suitable to mate with and engage holder 512. Holder 512 may be a unitary resilient member formed from a metal, a polymer, or any other suitable material.

Slots 508 are formed on opposite sides of encapsulant 506 so that holder 512 may snap into place and maintain heatsink 214 in contact with the top surface of electronic package 500 as shown in FIG. 5B. Heatsink 214 may be applied to electronic package 500 by placing heatsink 214 on the surface of electronic package 500, placing holder 512 over heatsink 214, and compressing holder 512 to insert holder 512 into slots 508. Optionally, heat transfer medium 218 may be used between encapsulant 506 and heatsink 214 as in the first exemplary embodiment. Heatsink 214 may be removed by compressing holder 512 to release holder 512 from slots 508.

Figure 6A:
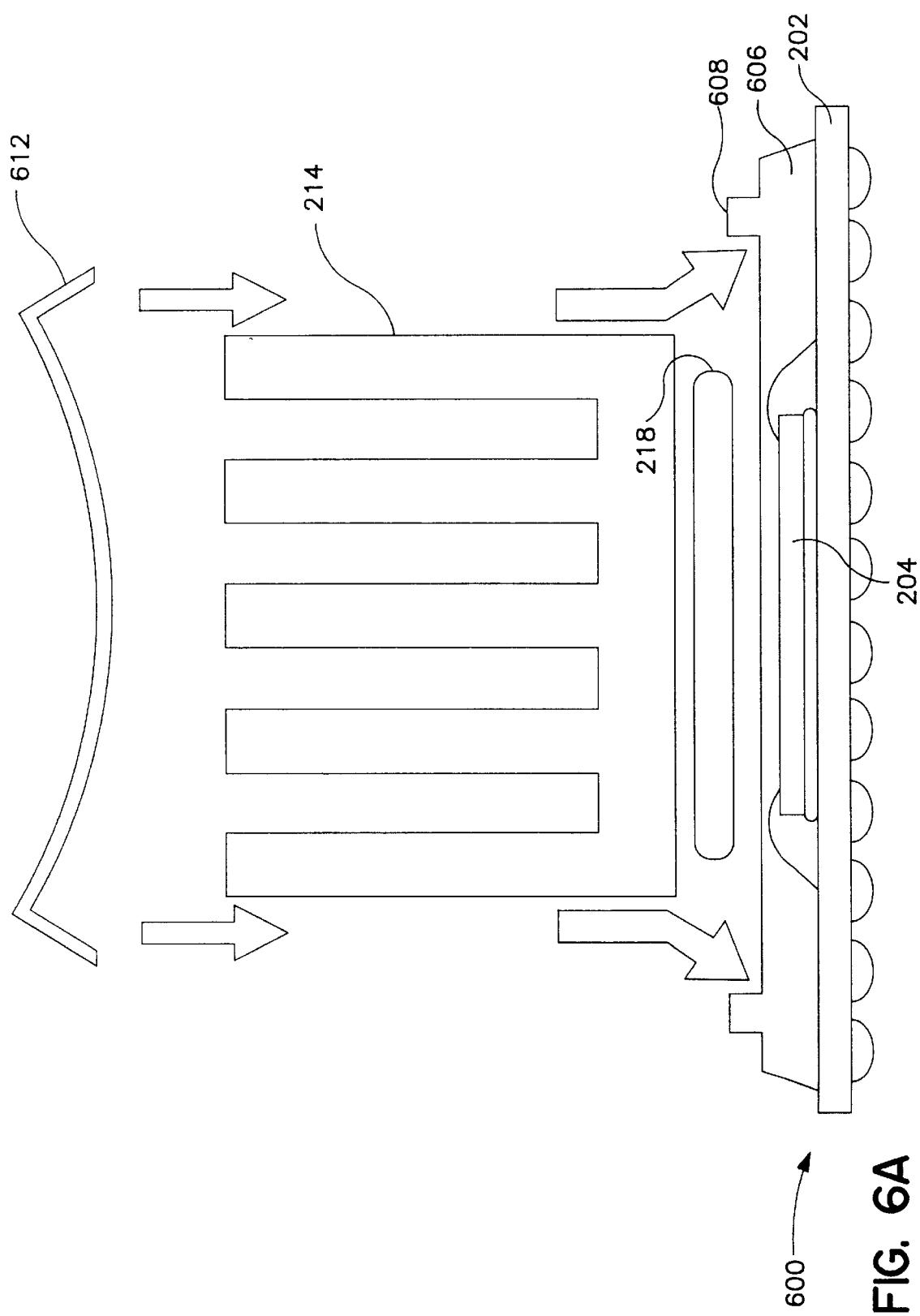
FIGS. 6A and 6B are side views of a fifth exemplary embodiment of the present invention.
Figure 6B:
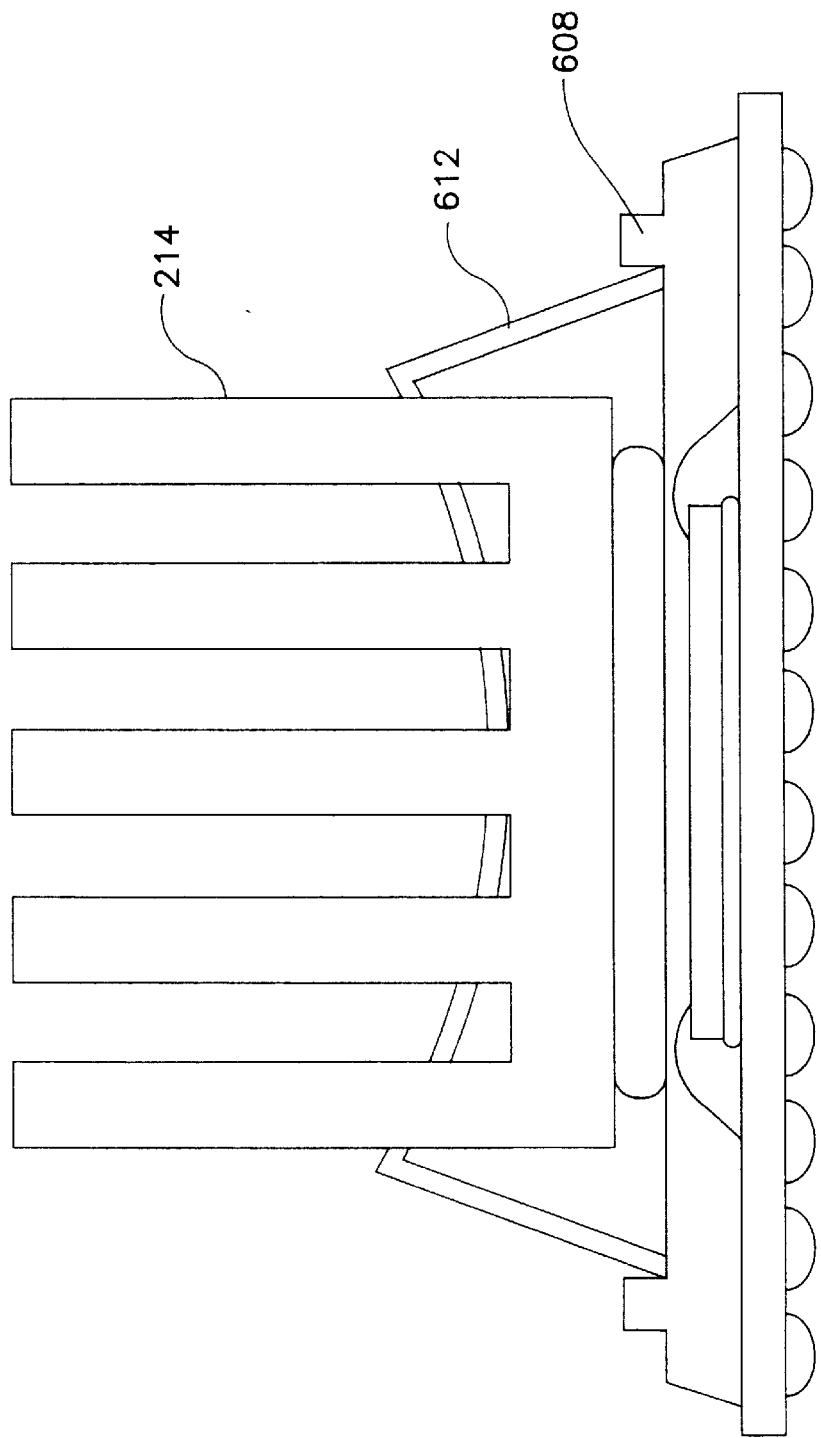

Referring to FIGS. 6A and 6B, a fifth exemplary embodiment of the present invention is shown. FIG. 6A shows that electronic package 600 is comprised of substrate 202, integrated circuit chip 204, encapsulant 606, and rib 608. In this exemplary embodiment, rib 608 is formed along the surface of encapsulant 606. Elements similar to those of the first exemplary embodiment are shown with identical designations.

As shown in FIG. 6A, rib 608 is formed on the surface of encapsulant 606 in this case to accommodate holder 612 if a thermal solution is desired. Rib 608 may be a an inverted U-shaped rib or any other shape suitable to mate with and engage holder 612. Holder 612 may be a unitary resilient member formed from a metal, a polymer, or any other suitable material. Ribs 608 are formed on opposite sides of encapsulant 606 so that holder 612 may snap into place and maintain heatsink 214 in contact with the top surface of electronic package 600 as shown in FIG. 6B. Heatsink 214 may be applied to electronic package 600 by placing heatsink 214 on the surface of electronic package 600, placing holder 612 over heatsink 214, and compressing holder 612 to engage holder 612 with ribs 608. Optionally, heat transfer medium 218 may be used between encapsulant 606 and heatsink 214 as in the first exemplary embodiment. Heatsink 214 may be removed by compressing holder 612 to release holder 612 from ribs 608.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An electronic package assembly comprising:
   a substrate having a first surface and a second surface;
   an integrated circuit chip having a top surface;
   first attaching means for attaching the integrated circuit chip to the first surface of the substrate;
   an overmold formed on the top surface of the integrated circuit chip and on the first surface of the substrate for encapsulating the integrated circuit chip, the overmold contacting at least a portion of the first surface of the substrate and having a top portion;
   orifices formed in the top portion of the overmold; and
   attaching members having an upper portion and a bottom portion, the attaching members detachably coupled to respective ones of the orifices at the bottom portion of the attaching members.

2. The electronic package assembly of claim 1, wherein the substrate is a laminated substrate having a plurality of layers.

3. The electronic package assembly of claim 2, wherein the substrate is a polymer.

4. The electronic package assembly of claim 1, wherein the integrated circuit chip is a wirebond chip having a lower surface and the first attaching means physically bonds the lower surface of the wirebond chip to the first surface of the substrate with a bonding agent and electrically connects the top surface of the wirebond chip to the first surface of the substrate with a wire.

5. The electronic package assembly of claim 1, wherein the overmold is a polymer.

6. The electronic package assembly of claim 1, wherein the attaching members are one of a push pin and a threaded post.

7. The electronic package assembly of claim 1, further comprising:
   heat dissipating means disposed on the top portion of the overmold, and
   third attaching means detachably coupled to the attaching members at the upper portion of the attaching members, the third attaching means aligned with the heat dissipating means and maintaining the heat dissipating means in contact with the top portion of the overmold.

8. The electronic package assembly of claim 7, further comprising heat transfer means disposed between the heat dissipating means and the overmold.

9. The electronic package assembly of claim 8, wherein the heat transfer means is one of an epoxy, an acrylic a thermal grease, a conductive pad and a thermal tape.

10. The electronic package assembly of claim 7, further comprising fourth attaching means for attaching the second surface of the substrate to a circuit board.

11. The electronic package assembly of claim 10, wherein the fourth attaching means is a ball grid array (BGA).

12. The electronic package assembly of claim 1, wherein the integrated circuit chip is a flip-chip having a lower surface and the first attaching means mechanically and electrically bonds the lower surface of the flip-chip to the first surface of the substrate.

13. The electronic package assembly of claim 12, wherein the first attaching means is one of a controlled collapse chip connection (C4), a gold bump, and a conductive epoxy.

14. An electronic package assembly comprising:
   a substrate having a first surface and a second surface;
   a flip-chip having a top surface and a bottom surface;
   first attaching means for attaching the flip-chip to the first surface of the substrate;
   encapsulating means for encapsulating the flip chip, the encapsulating means contacting at least a portion of the first surface of the substrate and having an upper portion;
   second attaching means formed along the upper portion of the encapsulating means; and
   attaching members having an upper portion and a bottom portion, the attaching members detachably coupled to the second attaching means at the bottom portion of the attaching members.

15. The electronic package assembly of claim 14, wherein the first attaching means mechanically and electrically bonds the bottom surface of the flip-chip to the first surface of the substrate.

16. The electronic package assembly of claim 15, wherein the first attaching means is one of a controlled collapse chip connection (C4), a gold bump, and a conductive epoxy.

17. A method for packaging an electronic assembly comprising the steps of:
   (a) attaching an integrated circuit chip to a first surface of a substrate using a first attachment,
   (b) encapsulating the integrated circuit chip using an encapsulant contacting the integrated circuit chip and at least a portion of the first surface of the substrate,
   (c) forming orifices in only a top portion of the encapsulant, and
   (d) detachably attaching a heat dissipater to the encapsulant using a third attachment, the third attachment coupled to the orifices formed in only the top portion of the encapsulant.

18. An electronic package assembly comprising:a
   a substrate having a first surface and a second surface;
   an integrated circuit chip having a top surface;
   first attaching means for attaching the integrated circuit chip to the first surface of the substrate;
   encapsulating means for encapsulating the integrated circuit chip, the encapsulating means contacting at least a portion of the first surface of the substrate and having a top portion;
   second attaching means formed in only the top portion of the encapsulating means; and
   attaching members having an upper portion and a bottom portion, the attaching members detachably coupled to the second attaching means at the bottom portion of the attaching members.

* * * * *

UNITED STATES PATENT AND TRADEMARK OFFICE
CERTIFICATE OF CORRECTION

PATENT NO. : 5,969,947
DATED : October 19, 1999
INVENTOR(S) : Eric A. Johnson et al.

It is certified that error appears in the above-identified patent and that said Letters Patent is hereby corrected as shown below:

<u>Title page,</u>
Item [56], References Cited, insert:
U.S. PATENT DOCUMENTS
-- 5,022,462   06/1991   Flint et al.
   5,249,101   09/1993   Frey et al.
   5,371,652   12/1994   Clemens et al.
   5,510,956   04/1996   Suzuki
   5,602,719   02/1997   Kinion --

-- OTHER DOCUMENTS
F. A. Almquist and H. B. Parsapour, "Spring-Clip Mounted Extruded Aluminum Heat Sink", IBM Technical Disclosure Bulletin, Vol. 23, No. 12 (May 1981) --

Signed and Sealed this

Twelfth Day of November, 2002

*Attest:*

*Attesting Officer*

JAMES E. ROGAN
*Director of the United States Patent and Trademark Office*